United States Patent

Hanright

[11] Patent Number: 5,915,031
[45] Date of Patent: Jun. 22, 1999

[54] MODULARIZED HEARING AID CIRCUIT STRUCTURE

[75] Inventor: William L. Hanright, Greenpond, N.J.

[73] Assignee: Siemens Hearing Instruments, Inc., Piscataway, N.J.

[21] Appl. No.: 08/716,690

[22] Filed: Sep. 17, 1996

Related U.S. Application Data

[63] Continuation-in-part of application No. 08/640,372, Apr. 30, 1996.

[51] Int. Cl.⁶ .................................................. H04R 25/00

[52] U.S. Cl. ........................... 381/323; 381/322; 381/324

[58] Field of Search ........................... 381/60, 68.1, 68.2, 381/68.4, 68.5, 68.6, 68.7, 69, 69.2, 231, 312, 314, 322, 323, 324, 327, 328, 330, FOR 133, FOR 134, FOR 135, FOR 137

[56] References Cited

U.S. PATENT DOCUMENTS 4,672,672   6/1987   Eggrt et al. ............................... 381/69

FOREIGN PATENT DOCUMENTS

| 0 453 200 A2 | 10/1991 | European Pat. Off. . |
| 0 500 988 A1 | 9/1992 | European Pat. Off. . |
| 44 44 586 C1 | 2/1996 | Germany . |
| 4444586 | 2/1996 | Germany . |
| 36 23 906 A1 | 1/1998 | Germany . |

*Primary Examiner*—Huyen Le
*Attorney, Agent, or Firm*—Mark H. Jay

[57] ABSTRACT

A support structure for use in a hearing aid has a plurality of support stations where circuit boards may be mechanically supported. The structure is mounted to the faceplate of the aid in front of the opening where the battery is inserted. The support structure is formed by two assemblies; each assembly is made up of a circuit board and a battery terminal.

11 Claims, 6 Drawing Sheets

MODULARIZED HEARING AID CIRCUIT STRUCTURE

CROSS-REFERENCE TO RELATED APPLICATION

This application is a continuation-in-part of commonly-owned application Ser. No. 08/640,372 filed Apr. 30, 1996. The entire disclosure of this copending patent application, including the drawings, is hereby incorporated herein as if fully set forth.

BACKGROUND OF THE INVENTION

The invention relates to hearing aids, and more particularly relates to circuits used in hearing aids. In its most immediate sense, the invention relates to modular in-ear hearing aid circuit structures from which a plurality of hearing aid models, particularly programmable models, may be assembled.

Hearing aid manufacturers offer an entire line of hearing aids. Each model incorporates a particular type of hearing aid circuit. When a dispenser fits a patient with a hearing impairment, the dispenser selects the particular hearing aid model having the circuit that best addresses the patient's needs.

Conventionally, hearing aid circuits are built up by hard-wiring discrete components together. As a result, hearing aid manufacturers are required to maintain a relatively large inventory of electronic components and subassemblies and to train manufacturing personnel to assemble those parts in many different configurations. These steps are costly.

Additionally, in-ear aids (ITE "in the ear" aids; CIC "completely in canal" aids; and canal aids) are custom-manufactured for the patient and therefore can vary widely in their physical configurations. This variation requires that the manufacture of the hearing aid circuit be highly customized to the intended application and such customization adds to manufacturing cost.

It would therefore be advantageous to provide a modularized hearing aid circuit that would reduce the number of different electronic subassemblies that must be maintained in inventory.

It would also be advantageous to provide a modularized hearing aid circuit that could, using a limited number of modules and physical configurations, be configured to constitute any one of the circuits in the manufacturer's line of hearing aids.

In accordance with one aspect of the invention, first and second battery terminals and first and second circuit boards are provided. Each of the terminals is supported by a corresponding one of the circuit boards. The circuit boards form a support having a plurality of support stations, for supporting a like plurality of additional circuit boards of rectangular shape and common width. The terminals are so located that a hearing aid battery inserted into the hearing aid contacts both of the battery terminals.

In accordance with this aspect of the invention, hearing aid circuits and circuit options (e.g. an amplifier circuit, a programmable control circuit, filter circuits, switching circuits etc.) are mounted on additional circuit boards, which are in turn mounted upon the support. This makes it easy to produce a hearing aid of the desired model merely by selecting the necessary components and mounting them (in the preferred embodiment, as many as four of them) upon the support.

In accordance with another aspect of the invention, which is particularly advantageous for use with programmable hearing aids, a multi-electrode strip is also provided. The additional circuit board (or boards) is (or are) electrically connected to this strip. In the preferred embodiment of this aspect of the invention, the distal end of this strip is terminated with programming terminals. This makes it possible to program the programmable control circuit using an external programmer.

In the preferred embodiment, at least one, and perhaps both, of the first and second circuit boards are provided with a capacitor. This permits a very large capacitance to be placed across the hearing aid battery. This is advantageous because when the battery is substantially discharged, the impedence of the battery can greatly increase the current drawn by the circuit during operation.

BRIEF DESCRIPTION OF THE DRAWINGS

The invention will be better understood with reference to the following exemplary and non-limiting drawings, in which.

DETAILED DESCRIPTION OF PREFERRED EMBODIMENTS

Figure 1:
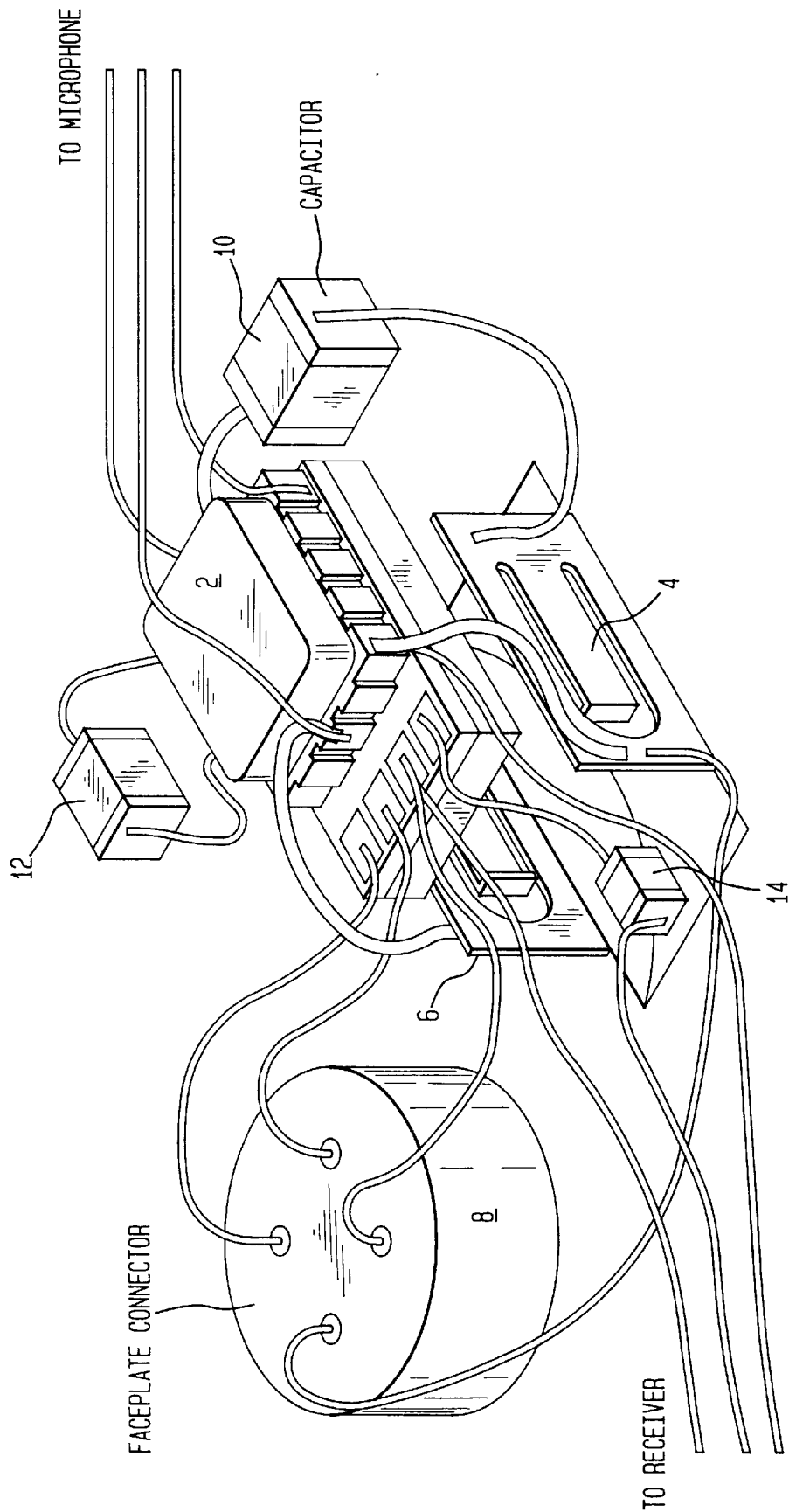
FIG. 1 illustrates the wiring in a typical programmable hearing aid of the type sold by assignee Siemens Hearing Instruments, Inc. under the IntelliVenience trademark.

In the following description, the same element is always indicated by the same reference number in all the Figures. The drawings are not to scale, and are occasionally exaggerated for clarity.

In a conventional programmable hearing aid of the type sold by assignee Siemens Hearins Instruments, Inc. under the IntelliVenience trademark, a hybrid circuit 2 is connected to two battery terminals 4 and 6 and to a four-line connector 8. The connector 8, which is mounted in the faceplate (not shown) of the aid, is used to program the hybrid circuit 2. A large capacitor 10 is hardwired between the terminals 4 and 6, and two other capacitors 12 and 14 are connected to the hybrid circuit 2 and to the hearing aid receiver (not shown) respectively.

As is immediately evident from FIG. 1, the assembly of the illustrated circuit is time-consuming and difficult. Space constraints may require the illustrated components to be relocated, and the capacitors 10, 12 and 14 must be wrapped with an insulator to avoid short circuits. Furthermore, it is difficult and frequently impossible to mount the various components (particularly the capacitors 10, 12 and 14) so they remain immobile when the aid is dropped or vibrated. Therefore, the aid may not be as mechanically robust as would be desirable.

Figure 2:
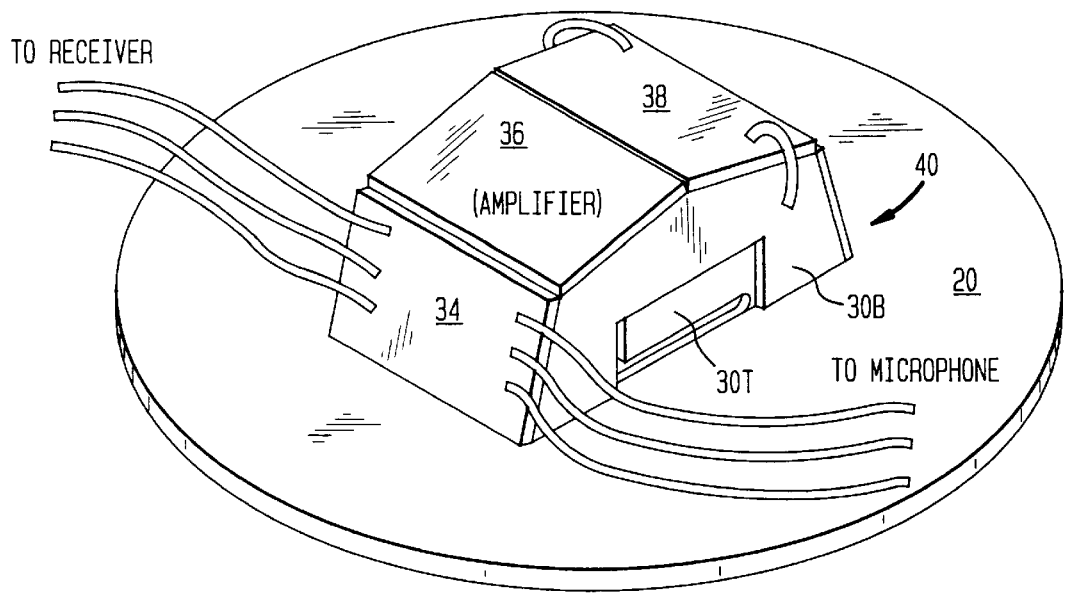
FIG. 2 illustrates the wiring in an IntelliVenience-type hearing aid in accordance with the preferred embodiment of the invention.

FIG. 2 shows the preferred embodiment of the invention. Generally, in accordance with the preferred embodiment, a hollow support structure is mounted on the faceplate of the aid and the interior of the support structure is accessible through the battery door. When the battery is inserted into the aid through the battery door, the battery is located within the support structure. Furthermore, the support structure has a plurality of support stations where circuit boards may be attached. As will become evident below, the preferred embodiment not only makes it possible to easily assemble a variety of models using the same platform, but is also versitile and mechanically robust.

Figure 3:
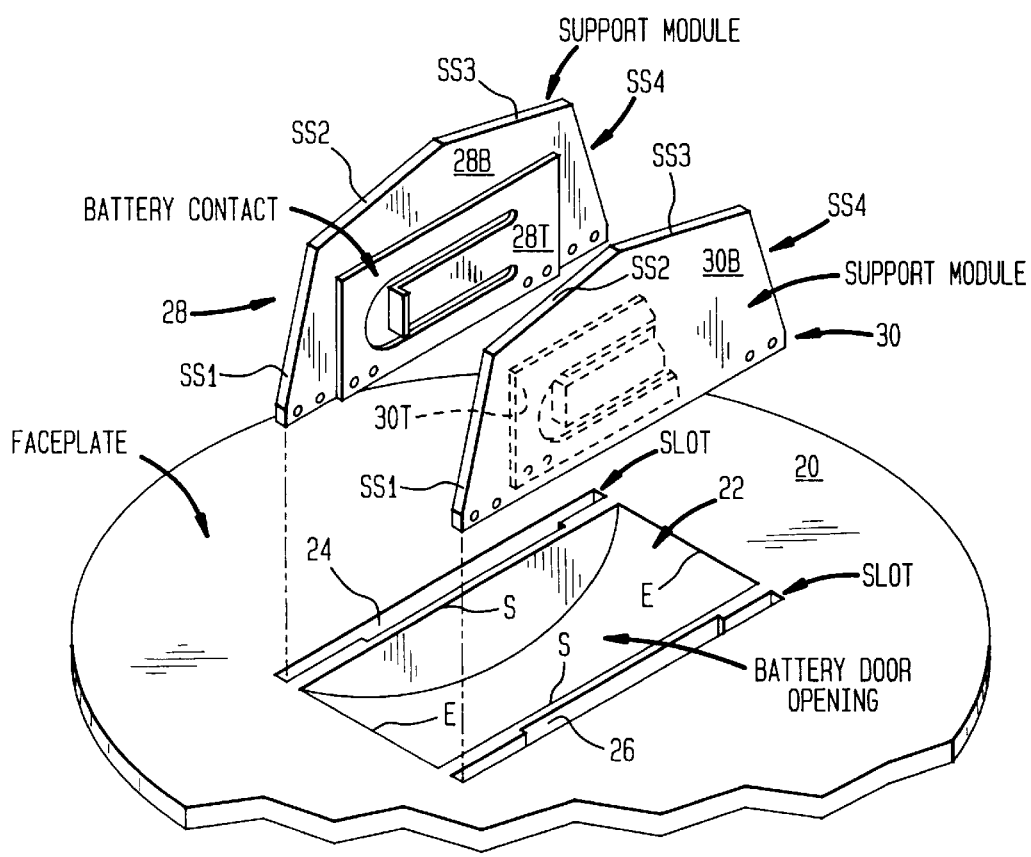
FIG. 3 illustrates how the battery terminals and supporting circuit boards may be mounted to the faceplate of an in-ear hearing aid.

FIG. 3 shows a faceplate 20 of a preferred embodiment in accordance with the invention. The faceplate 20 has an opening 22, which is dimensioned to receive a hearing aid battery (not shown) and which in use may be closed off by a battery door. (The battery door is not shown in FIG. 3.) The opening 22 is rectangular and has two elongated sides S and two ends E. Two slots 24 and 26 are located in the faceplate 20 adjacent the sides S.

The slots 24 and 26 are shaped to receive corresponding assemblies 28 and 30, respectively. Each of the assemblies 28 and 30 has a circuit board (28B and 30B respectively) and a battery terminal 28T and 30T respectively. In each of the assemblies 28 and 30, the battery terminal (28T, 30T) is electrically and mechanically connected to the circuit board 28B, 30B) and each assembly 28, 30 is inserted into the corresponding slot 24, 26 and held therein by adhesive. The spacing of the assemblies 28, 30 and the dimensioning of the terminals 28T, 30T is such that when a hearing aid battery (not shown) is inserted into the aid through the opening 22, it makes electrical contact with the terminals 28T, 30T and is held between them.

Figure 4A:
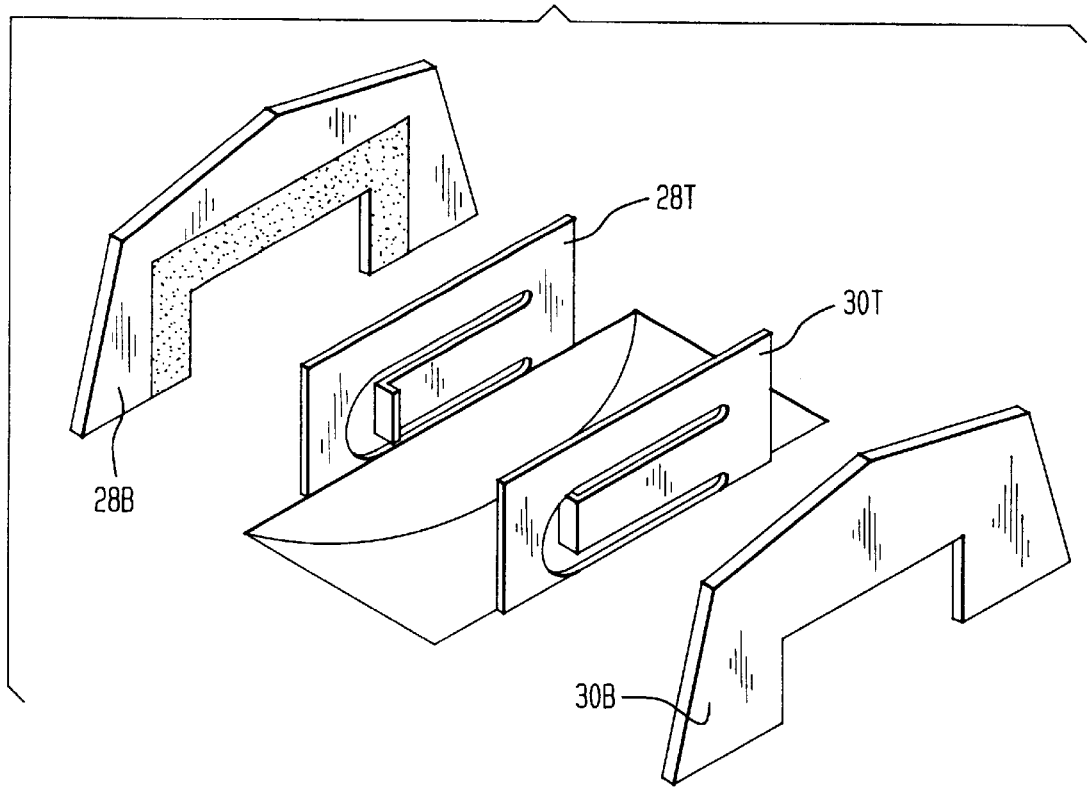
FIGS. 4A and 4B illustrate an alternate structure to the structure illustrated in FIG. 3.
Figure 4B:
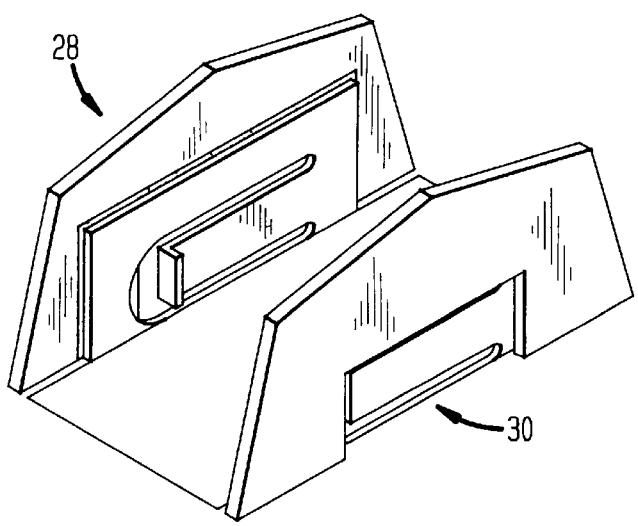

An alternate to the FIG. 3 structure is shown in FIGS. 4A and 4B. Here, the assemblies 28' and 30' use the same terminals 28T, 30T but the circuit boards 28B' and 30B' have slightly different shapes than the circuit boards 28B and 30B and the assemblies 28' and 30' are not held within slots in the faceplate (not shown).

The assemblies shown in FIGS. 3, 4A and 4B form a support structure having a plurality of support stations at which circuit boards may be attached. In these examples, there are four support stations formed by surfaces SS1, SS2, SS3, and SS4 respectively (see FIG. 3), but the number of support stations is not a part of the invention. There may be more or fewer.

Each support station allows a rectangular circuit board (not shown in FIG. 3) of a predetermined width to rest upon, and to be mechanically supported by, the support structure. In this example, larger boards can be supported on the top of the support structure, but this is not required.

In this preferred embodiment, the support structure provides mechanical support for the additional circuit boards, the electrical connections with the boards being provided through a multi-electrode strip described below. However, this is not required, and such electrical connections may alternatively be established using mating electrical pads on the circuit boards.

In conventional programmable hearing aids, a large capacitor is placed across the battery so that the internal impedence of the battery does not affect the performance of the aid when the battery has been substantially discharged. If desired, such a capacitor can be provided in the preferred embodiment by forming a capacitor on one or both of the circuit boards in the support structure. This can be accomplished by using a multilayer circuit board and using adjacent spaced-apart layers as plates of a capacitor. This technique is known by itself.

Figure 5:
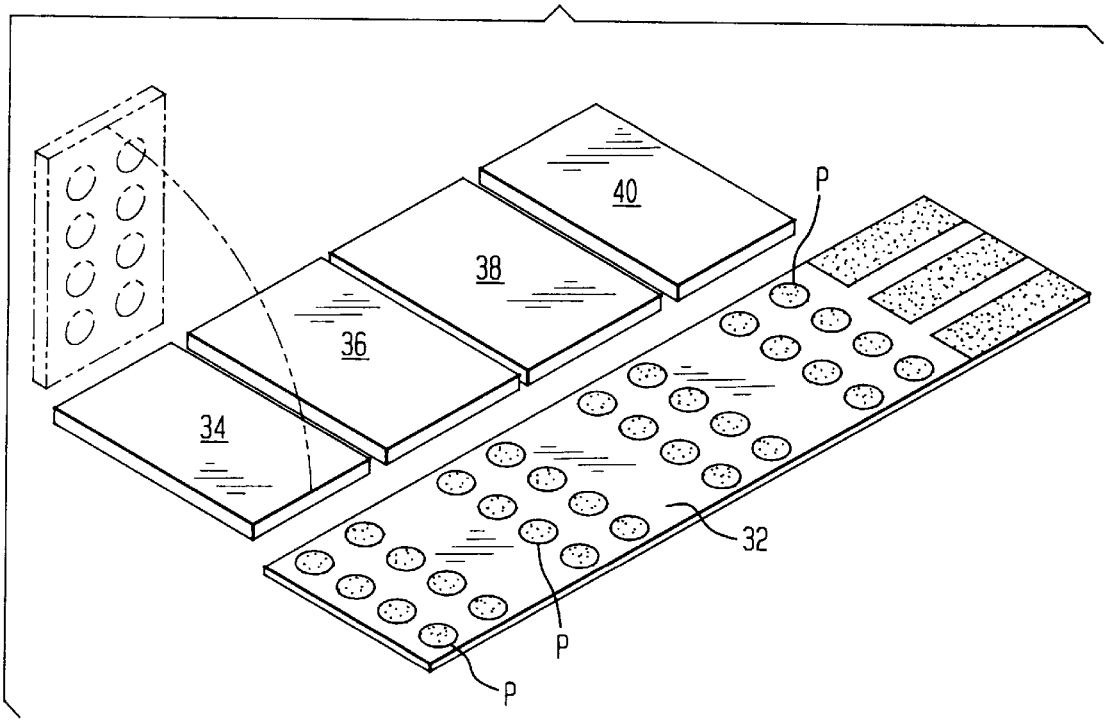
FIGS. 5 and 6 schematically illustrate how additional circuit boards may be electrically connected together.
Figure 6:
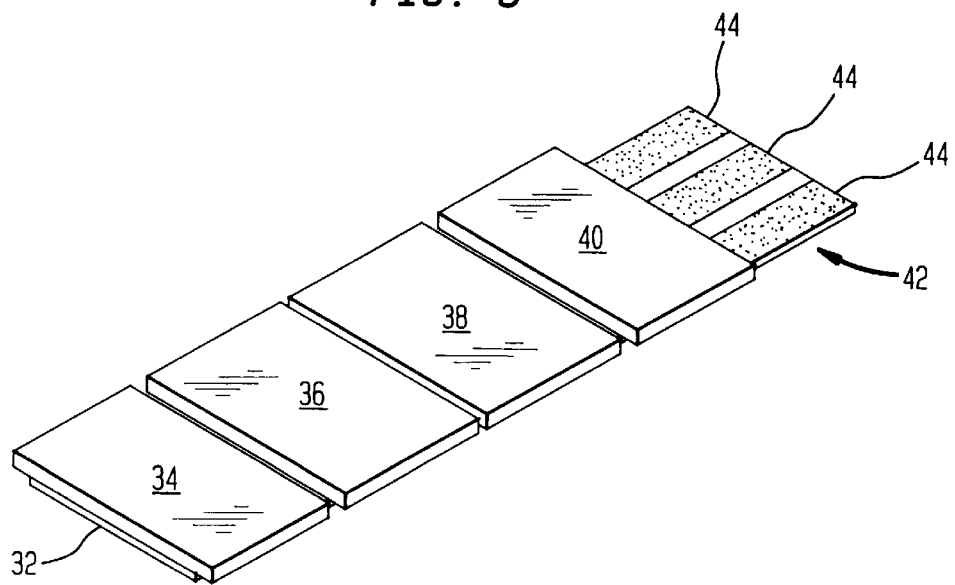
Figure 7A:
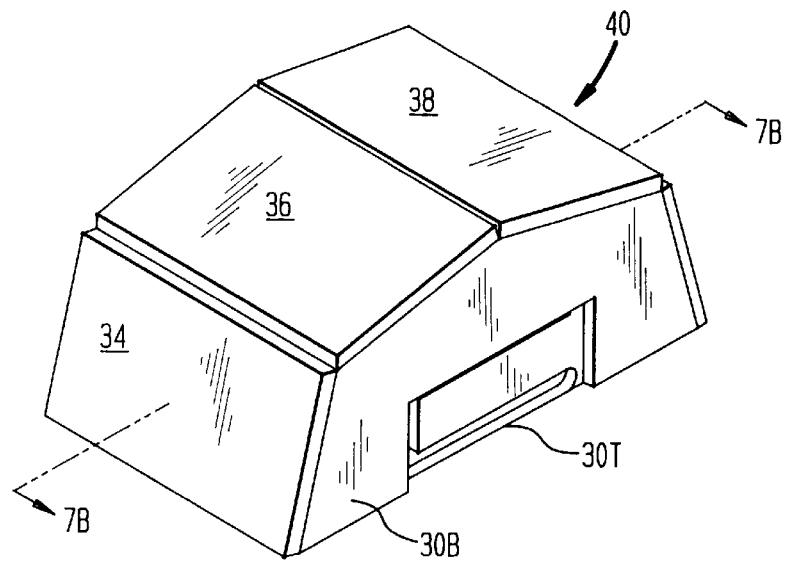
FIGS. 7A, 7B and 8 schematically illustrate how a programmable hearing aid in accordance with a preferred embodiment of the invention can be programmed using an external programmer.
Figure 7B:
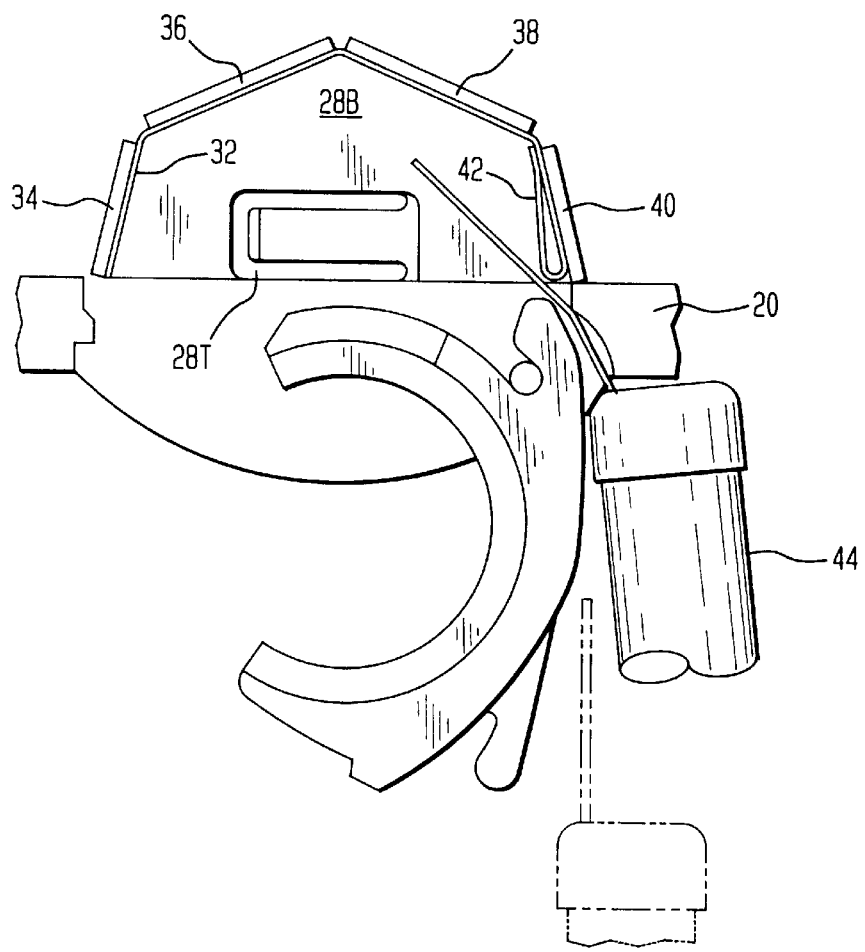
Figure 8:
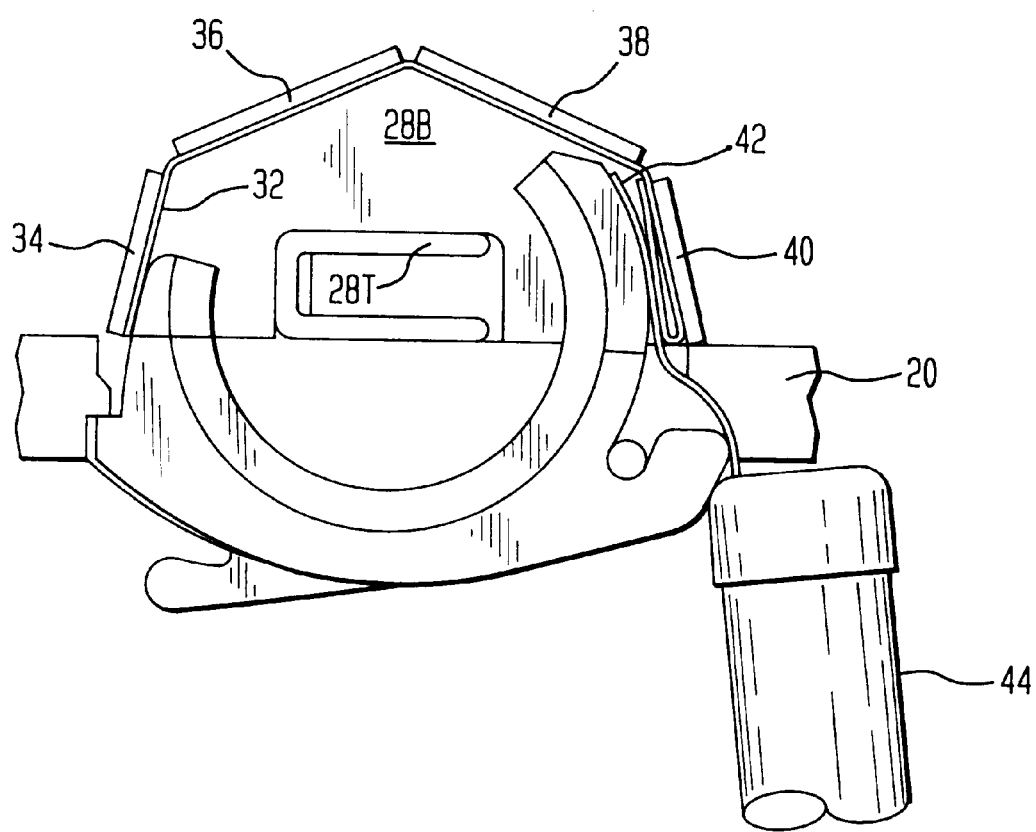

FIG. 5 illustrates how a multi-electrode strip 32 can be used to make the necessary electrical interconnections between additional circuit boards 34, 36, 38 and 40. The multi-electrode strip 32 has a plurality of electrical pads P; in this example, there are four groups of 8 pads so that it is possible to make as many as 8 electrical connections with each of the circuit boards 34, 36, 38 and 40. This is exemplary; the number of pads P and the arrangement of the pads P on the strip 32 is not a part of the invention.

Ordinarily, one of the circuit boards 34, 36, 38, 40 will contain an amplifier circuit, and another one will contain a programmable control circuit. Other circuit options, such as filters, switching circuits etc. can be contained in other circuit boards and connected as required for the particular model being assembled. Thus, it is easy to assemble a large number of different models of hearing aids merely by selecting the proper circuit boards, connecting them to the multi-electrode strip 32, and mounting them to the support structure. Individualized wiring is unnecessary.

The multi-electrode strip 32 has a distal end 42 on which three programming electrodes 44 are located. (The number of electrodes 44 is not a part of the invention.) Advantageously, the distal end 42 is folded over to form an integral spring, adjacent one of the ends E of the opening 22. In this manner, the programmable control circuit can be programmed using the cable 44 from a external programmer (not shown).

In the preferred embodiment, a "beside the door" programming system is used to program the programmable control circuit. The preferred system is disclosed in commonly-owned pending U.S. patent application Ser. No. 08/640,372 filed Apr. 30, 1996. However, this is not required and it would alternatively be possible to e.g. make connections through a connecter mounted on the faceplate, as in the known IntelliVenience aid.

Although reference has been made to "circuit boards", this is not limited to e.g. printed circuit boards. The circuit boards 34, 26, 38 and 40 can also be, and indeed usually will be, ceramic structures in which electronic circuit(s) are embedded.

Although a preferred embodiment of the invention has been described above, the scope of the invention is limited only by the following claims:

I claim:

1. A modularized hearing aid circuit, comprising:
    first and second battery terminals;
    first and second circuit boards, each being mechanically and electrically connected to a corresponding one of the battery terminals in a manner that a hearing aid battery inserted into the hearing aid contacts both the battery terminals; and
    a third circuit board, the third circuit board including an amplifier circuit that is electrically connected to the battery terminals, the third circuit board being mechanically supported by the first and second circuit boards.

2. The circuit of claim 1, wherein the electrical connection between the third circuit board and the battery terminals passes through the first and second circuit boards.

3. A modularized hearing aid circuit, comprising:
    first and second battery terminals;
    first and second circuit boards, each being mechanically and electrically connected to a corresponding one of the battery terminals in a manner that a hearing aid battery inserted into the hearing aid contacts both the battery terminals;

a third circuit board including an amplifier circuit, the third circuit board being mechanically supported between the first and second circuit boards; and a multi-electrode strip, the strip being electrically connected to the third circuit board and to the battery terminals.

4. The circuit of claim 3, further including a programmable control circuit that is operatively connected to the amplifier circuit, and a plurality of programming terminals mounted to the strip, the programming terminals being electrically connectable to an external programmer and electrically connected to the programmable control circuit.

5. The circuit of claim 4, wherein the programming terminals are located at a distal end of the strip and the distal end of the strip is folded over to form an integral spring.

6. The circuit of claim 5, wherein the programmable control circuit is located on a fourth circuit board that is electrically connected to the strip and is mechanically supported between the first and second circuit boards.

7. The circuit of claim 1 or 3, further comprising a capacitor formed on at least one of the first and second circuit boards.

8. A modular hearing aid circuit structure for use in programmable hearing aids, comprising:

a hearing aid faceplate having an interior surface, an exterior surface and an elongated opening for receiving a hearing aid battery, the opening having two elongated sides and two ends;

first and second circuit boards having a common shape and together defining a circuit board support having a plurality of support stations for supporting a plurality of additional circuit boards of rectangular shape and common width, the first and second circuit boards being mounted to the faceplate adjacent the sides of the opening; and first and second battery terminals, each battery terminal being mounted to, and electrically connected with, a corresponding one of the first and second circuit boards, the opening, the first and second circuit boards and the first and second battery terminals being so located and dimensioned that the battery introduced through the opening will be held between the terminals and is in electrical contact therewith;

at least two additional circuit boards of said width, a one of the additional circuit boards containing an amplifier circuit and another one of the additional circuit boards containing a programmable control circuit, the programmable control circuit being operatively connected to the amplifier circuit;

a multi-electrode strip, the strip being electrically connected to at least the another one of the two additional circuit boards and to the battery terminals; and a plurality of programming terminals mounted to the strip, the programming terminals being electrically connectable to an external programmer and electrically connected to the programmable control circuit, the programming terminals being adjacent the opening.

9. The structure of claim 8, wherein the programming terminals are located at a distal end of the strip and the distal end of the strip is folded over to form an integral spring.

10. The structure of claim 9, wherein the distal end of the strip is located adjacent an end of the opening.

11. A modularized hearing aid circuit, comprising:

first and second battery terminals;

first and second circuit boards, each being mechanically and electrically connected to a corresponding one of the battery terminals in a manner that a hearing aid battery inserted into the hearing aid contacts both the battery terminals;

a third circuit board, the third circuit board including an amplifier circuit that is electrically connected to the battery terminals, the third circuit board being mechanically supported between the first and second circuit boards;

a fourth circuit board, the fourth circuit board being mechanically supported between the first and second circuit boards and containing a programmable control circuit; and a plurality of programming terminals, the programming terminals being electrically connected with the programmable control circuit.

* * * * *